United States Patent
Lin et al.

(10) Patent No.: US 9,147,835 B2
(45) Date of Patent: Sep. 29, 2015

(54) TUNNEL TRANSISTOR STRUCTURE INTEGRATED WITH A RESISTANCE RANDOM ACCESS MEMORY (RRAM) AND A MANUFACTURING METHOD THEREOF

(71) Applicant: Fudan University, Shanghai (CN)

(72) Inventors: Xi Lin, Shanghai (CN); Pengfei Wang, Shanghai (CN); Qingqing Sun, Shanghai (CN); Wei Zhang, Shanghai (CN)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 13/663,180

(22) Filed: Oct. 29, 2012

(65) Prior Publication Data
US 2013/0341697 A1   Dec. 26, 2013

(30) Foreign Application Priority Data
Jun. 21, 2012   (CN) .......................... 2012 1 0206222

(51) Int. Cl.
*H01L 29/76* (2006.01)
*H01L 45/00* (2006.01)
*H01L 27/24* (2006.01)

(52) U.S. Cl.
CPC ........ *H01L 45/1206* (2013.01); *H01L 27/2436* (2013.01); *H01L 45/16* (2013.01); *H01L 45/04* (2013.01); *H01L 45/1233* (2013.01); *H01L 45/146* (2013.01); *H01L 45/1616* (2013.01)

(58) Field of Classification Search
CPC .. H01L 29/7311; H01L 45/1206; H01L 45/16
USPC ......................................................... 257/314
See application file for complete search history.

(56) References Cited

U.S. PATENT DOCUMENTS

2009/0034355 A1* 2/2009 Wang ...................... 365/230.01
2011/0316060 A1* 12/2011 Yao et al. ...................... 257/298
(Continued)

FOREIGN PATENT DOCUMENTS

| CN | 101777570 | * | 7/2010 | .......... H01L 21/8239 |
| CN | 102185105 | * | 9/2011 | .............. H01L 45/00 |

OTHER PUBLICATIONS

Boucart et al. Double-Gate Tunnel FET with High-K Gate Dielectric. IEEE Transactions on Electron Devices, vol. 54, No. 7, Jul. 2007.*
(Continued)

*Primary Examiner* — Matthew Landau
*Assistant Examiner* — Eric Ashbahian
(74) *Attorney, Agent, or Firm* — Jenkins, Wilson, Taylor & Hunt, P.A.

(57) ABSTRACT

The invention relates to the technical field of semiconductor memories, in particular to a tunnel transistor structure integrated with a resistance random access memory and a manufacturing method thereof. The tunnel transistor structure in the present invention comprises a semiconductor substrate, and a tunnel transistor and a resistance random access memory formed on the semiconductor substrate, wherein the gate dielectric layer of the tunnel transistor extends to the surface of a drain region of the tunnel transistor; the part of the gate dielectric layer on the surface of the drain region of the tunnel transistor forms the resistance-variable storage layer of the resistance random access memory. In this invention, the high-quality gate dielectric layer of the tunnel transistor and the resistance-variable storage layer of the resistance random access memory are obtained by primary atomic layer deposition which integrates the resistance random access memory and tunnel transistor together without increasing steps. This process is simple and can combine the shallow trench isolation or field oxygen isolation and ion implantation or diffusion of source electrode and drain electrode to make integration convenient.

3 Claims, 6 Drawing Sheets

(56) References Cited

U.S. PATENT DOCUMENTS

2012/0020138 A1* 1/2012 Lue et al. .................. 365/63
2014/0034891 A1 2/2014 Wang et al.

OTHER PUBLICATIONS

English Translation of Chinese Patent CN102185105 to Lin, Sep. 14, 2011.*

* cited by examiner

TUNNEL TRANSISTOR STRUCTURE INTEGRATED WITH A RESISTANCE RANDOM ACCESS MEMORY (RRAM) AND A MANUFACTURING METHOD THEREOF

CROSS-REFERENCE TO RELATED APPLICATION

This application claims priority to Chinese Patent Application No. CN201210206222.X filed on Jun. 21, 2012, the entire content of which is incorporated by reference herein.

BACKGROUND OF THE INVENTION

1. Technical Field

The invention relates to the technical field of semiconductor memories with a dimension below 20 nm, in particular to a tunnel transistor structure integrated with a RRAM and a manufacturing method thereof.

2. Description of Related Art

Information reading and writing of the RRAM is realized by reading or changing the resistance of the resistance-variable material. Usually, the resistance-variable material has a high resistance state and a low resistance state. The RRAM stores information using these kinds of materials by switching between the two states. FIG. 1 illustrates a sectional view of a typical RRAM unit. In this RRAM unit 10, a resistance-variable storage layer 12 is placed between a top electrode 11 and a bottom electrode 13. By the action of an external voltage, the resistance of the resistance-variable storage layer 12 can be in a high state and a low state, which are represented by "0" and "1". With different voltages, the resistance of the RRAM can be switched between the high state and the low state to realize information storage. The RRAM has advantages of simple preparation, high storage density, low operation voltage, quick speed of reading and writing, long service time, nondestructive access, low power, and in comparison with CMOS (complementary metal-oxide-semiconductor), high process compatibility, and therefore is regarded as one of the most powerful candidates for the next generation of "universal" memories.

At present, MOS transistor structures (metal-oxide-semiconductors, namely field effect transistors) are usually adopted as the driving circuit of the RRAM, and the RRAM is usually formed in the subsequent interconnection procedure of the MOS transistor. Meanwhile, along with the continuous development of the technologies of integrated circuit devices, the leakage current between the drain region and drain region rises rapidly along with the reduction of the length of the trench. Below 30 nm, it is necessary to use a new device to realize a small leakage current so as to lower the power consumption of the chip. One of the schemes to solve the above mentioned problem is to adopt a tunnel transistor structure. The tunnel transistor has a very tiny leakage current and can further reduce the dimensions of the circuit and the voltage to lower the power consumption of the chip.

BRIEF SUMMARY OF THE INVENTION

The objective of the invention is to provide a tunnel transistor structure integrated with a RRAM and a manufacturing method thereof to simplify the process of integrating the RRAM and the driving circuit thereof and lower the power consumption of the chip.

The tunnel transistor structure integrated with a RRAM provided by the present invention comprises:

A semiconductor substrate;

A tunnel transistor and a RRAM formed on said semiconductor substrate,

A gate dielectric layer of said tunnel transistor extending to the surface of a drain region of said tunnel transistor;

And the part of the gate dielectric layer on the surface of the drain region of the tunnel transistor forms a resistance-variable storage layer of said RRAM.

Furthermore, said semiconductor substrate is silicon or silicon on an insulator. The gate dielectric layer of the tunnel transistor is made from $Al_2O_3$, $HfO_2$, or other resistance-variable materials with a high dielectric constant.

Meanwhile, the present invention also provides a method for manufacturing the tunnel transistor structure integrated with the RRAM, comprising Forming a primary insulating film on the surface of a provided semiconductor substrate;

Depositing a photoresist layer on the primary insulating film;

Performing masking, exposure, and development to define the position of a source region of the tunnel transistor on the photoresist;

Etching the primary insulating film at the position of the resource region to expose the substrate;

Forming the source region of a primary doping type in said semiconductor substrate;

Stripping the photoresist;

Depositing a photoresist layer on above mentioned structure;

Performing masking, exposure, and development to define the position of a drain region of the tunnel transistor on the photoresist;

Etching the primary insulating film at the position of the drain region to expose the substrate;

Forming the drain region of a second doping type in said semiconductor substrate;

Stripping the photoresist;

Etching said primary insulating film to expose positions of a gate region of the tunnel transistor;

Growing a second insulating film on the surface of said semiconductor substrate by atomic layer deposition;

Depositing a primary conductive film on said second insulating film;

Depositing a photoresist layer on the above mentioned structure and performing masking, exposure, and development to form patterns;

Etching to remove the exposed part of the primary conductive film and the rest of the primary conductive film forming a gate electrode of the tunnel transistor;

Etching to remove said primary insulating film above said source region and reserving said primary insulating film above said drain region; said primary insulating film reserved above said drain region forming the resistance-variable storage layer of the RRAM.

Furthermore, said primary insulating film is silicon oxide. Said second insulating film is made from a resistance-variable material with a high dielectric constant, such as $Al_2O_3$ or $HfO_2$. Said primary conductive film is doped polycrystalline silicon.

Furthermore, said primary doping type is n-type, while said second doping type is p-type; or said primary doping type is p-type, and said second doping type is n-type.

In this invention, the high-quality gate dielectric layer of the tunnel transistor and the resistance-variable storage layer of the RRAM are obtained by primary atomic layer deposition which integrates the RRAM and MOS transistor together without increasing steps. This process is simple and can combine the shallow trench isolation or field oxygen isolation and ion implantation or diffusion of source electrode and drain electrode to make integration convenient.

DETAILED DESCRIPTION OF THE INVENTION

The invention is further described in detail with the reference of the attached drawings and the embodiments. In the figures, to facilitate description, the layer thickness and region thickness are amplified, but the sizes do not represent the actual dimensions. The figures fail to reflect the actual dimensions of the device accurately, but show the mutual positions of the regions and the structures completely, especially the vertical and horizontal neighboring relationship of the structures.

Figure 1:
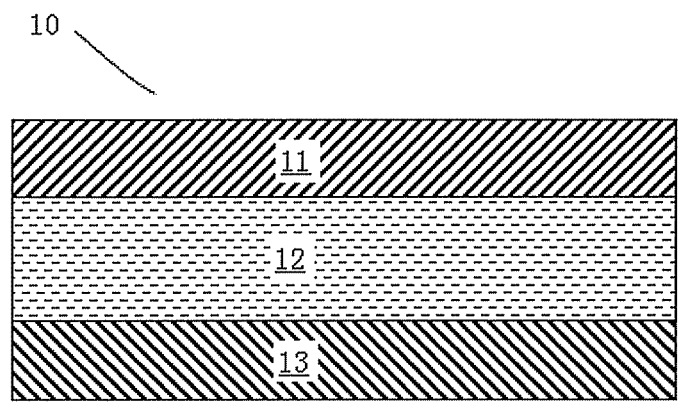
FIG. 1 is a sectional view of a RRAM structure in the prior art.
Figure 2:
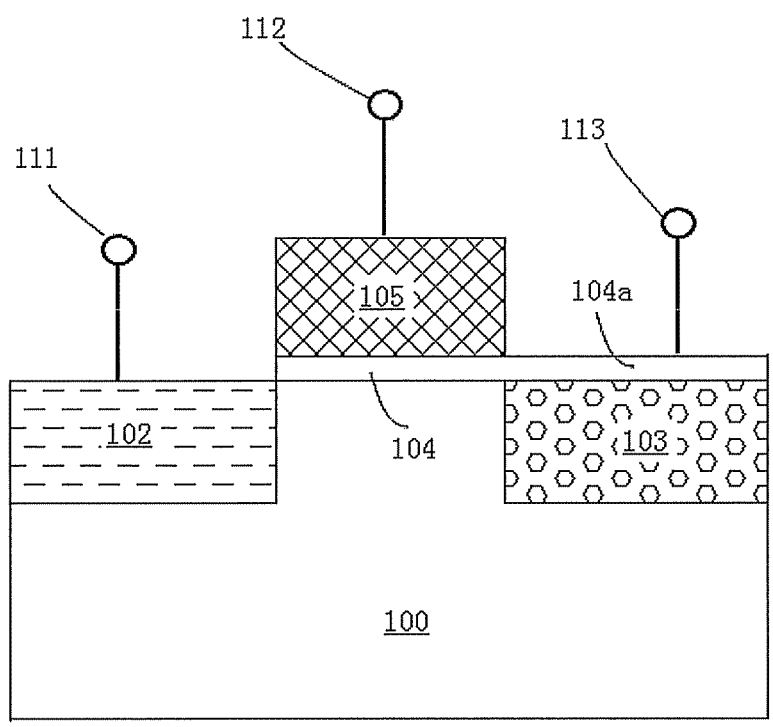
FIG. 2 is a sectional view of a tunnel transistor structure integrated with a RRAM in one embodiment of the present invention.

FIG. 2 illustrates a tunnel transistor structure integrated with a RRAM in one embodiment of the present invention, which is a sectional view along the trench length direction of this unit. As shown in FIG. 2, this unit is usually formed in a semiconductor substrate or a doped pit 100. Said semiconductor substrate or doped pit 100 is usually doped with n-type or p-type impurities at a low concentration. The doping type of the source region 102 and drain region 103 is opposite to that of the pit 100. The source region 102 as the source electrode of the tunnel transistor can be connected with an external electrode 111 directly or via a contact, and the gate electrode 105 of the MOS transistor can be connected with an external electrode 112 directly or via a contact. The gate dielectric layer 104 of the tunnel transistor exceeds the gate electrode and extends above the drain region 103, wherein the part 104a of the gate dielectric layer extending to be above the drain region 103 forms the resistance-variable storage layer of the RRAM; the lower surface of the resistance-variable storage layer 104a is connected with the drain region 103 of the tunnel transistor, while the upper surface of the resistance-variable storage layer 104a is connected with an external electrode 113 directly or via a contact.

Figure 3:
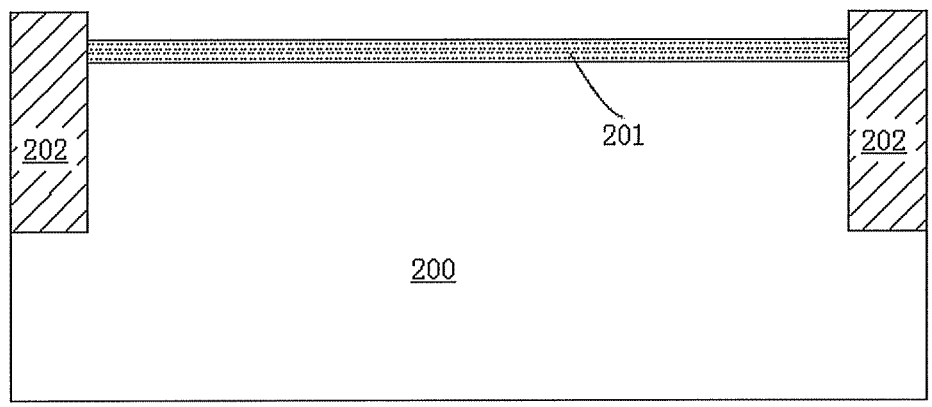
FIGS. 3-11 illustrate a workflow chart of a method for manufacturing a tunnel transistor structure integrated with a RRAM in one embodiment of the present invention.

The tunnel transistor structure integrated with the RRAM disclosed in the present invention can be manufactured by many methods. The following is one embodiment of a method for manufacturing an n-type tunnel transistor structure integrated with a RRAM as shown in FIG. 2 of the present invention. FIGS. 3-11 depict a part of procedures of an integrated circuit composed of the structure as shown in FIG. 2 of the present invention. A silicon substrate is taken as an example As shown in FIG. 3, first, form a shallow trench isolation (STI) structure or a field oxygen isolation structure in a light p-type ion-doped silicon substrate 200. This procedure is well-known in the field, illustrated by the STI structure 202 in the embodiment of the present invention. Second, grow a silicon oxide film 201 on the surface of the silicon substrate 200.

To manufacture a p-type tunnel transistor structure integrated with a RRAM, the p-type silicon substrate is required to be replaced by an n-type silicon substrate or an n-pit is manufactured in the p-type silicon substrate, and meanwhile the n-type doping is interchanged with the p-type doping in the description below.

Figure 4:
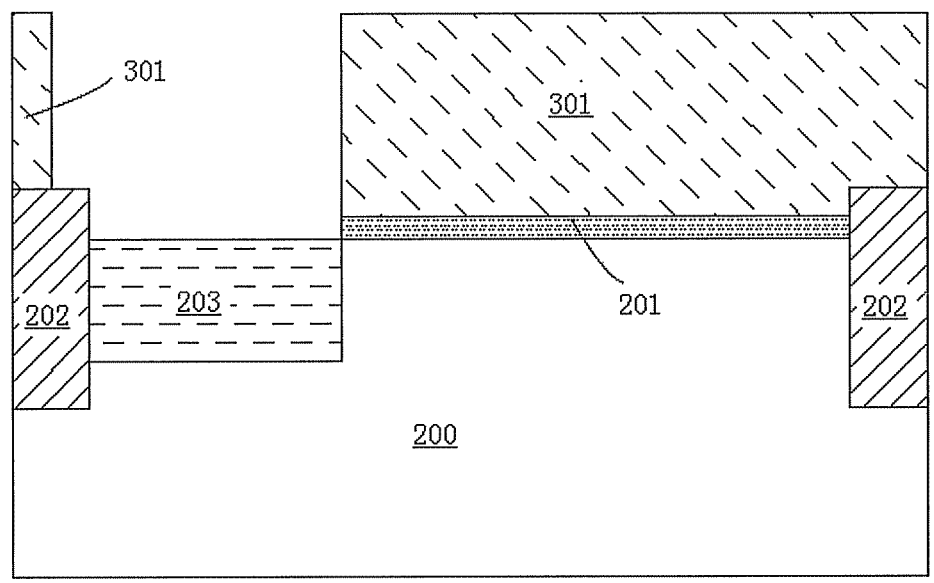

Third, deposit a photoresist layer 301 on the silicon oxide film 201; perform masking, exposure, and development to define the position of the source region of the tunnel transistor; etch to remove the silicon oxide film 201 at the position of the source region to expose the surface of the silicon substrate 200; and then form the n-type source region 203 of the tunnel transistor in the silicon substrate 200 by ion implantation or iron diffusion, as shown in FIG. 4.

Figure 5:
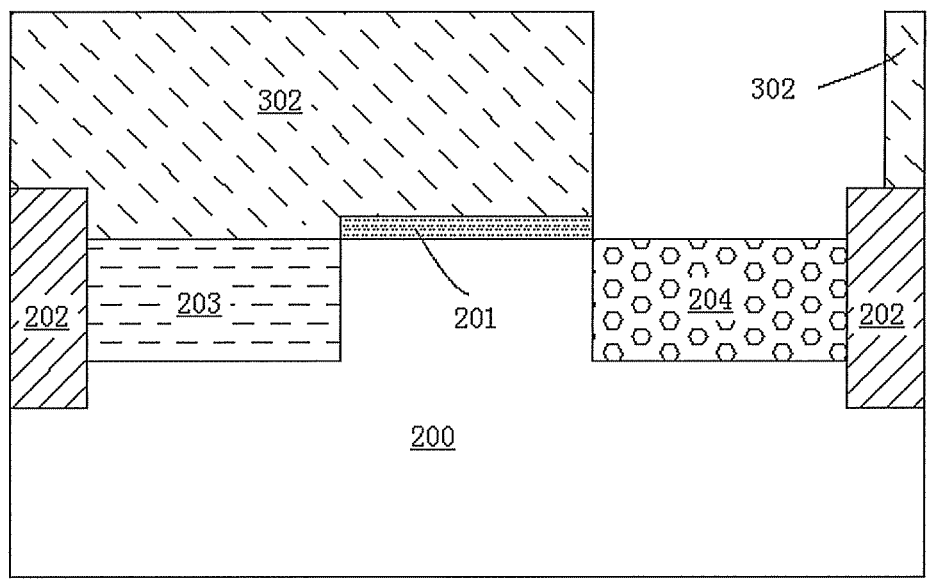

Fourth, strip the photoresist layer 301; deposit a new photoresist layer 302; perform masking, exposure, and development to define the position of the drain region of the tunnel transistor; etch to remove the silicon oxide film 201 at the position of the drain region to expose the surface of the silicon substrate 200; and then form the p-type drain region 204 of the tunnel transistor in the silicon substrate 200 by ion implantation or iron diffusion, as shown in FIG. 5.

Figure 6:
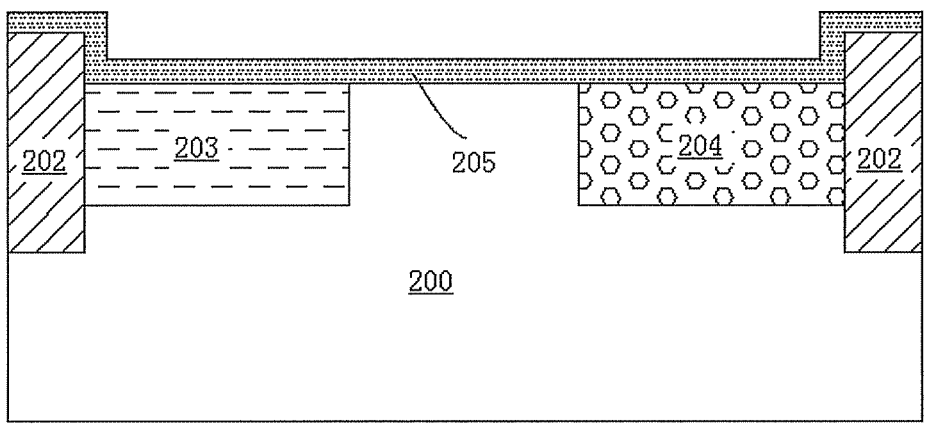

Fifth, strip the photoresist 302 and etch to remove the rest of the silicon oxide film 201 to expose the silicon substrate 200; place the simple into an atomic layer deposition device to grow a 2-20 nm $HfO_2$ gate dielectric layer 205 on the surface of the silicon substrate 200 by atomic layer deposition, as shown in FIG. 6.

Sixth, deposit a doped polycrystalline silicon film on the gate dielectric layer 205 and a photoresist layer on the polycrystalline silicon film; perform masking, exposure, and development to form patterns; protect the polycrystalline silicon film at the gate electrode of the tunnel transistor with the photoresist; etch to remove the exposed polycrystalline silicon film, wherein the rest of the polycrystalline silicon film forms the gate electrode 206 of the tunnel transistor, and the gate electrode 206 is located on the silicon substrate 200 between the source region 203 and the drain region 204.

Figure 7:
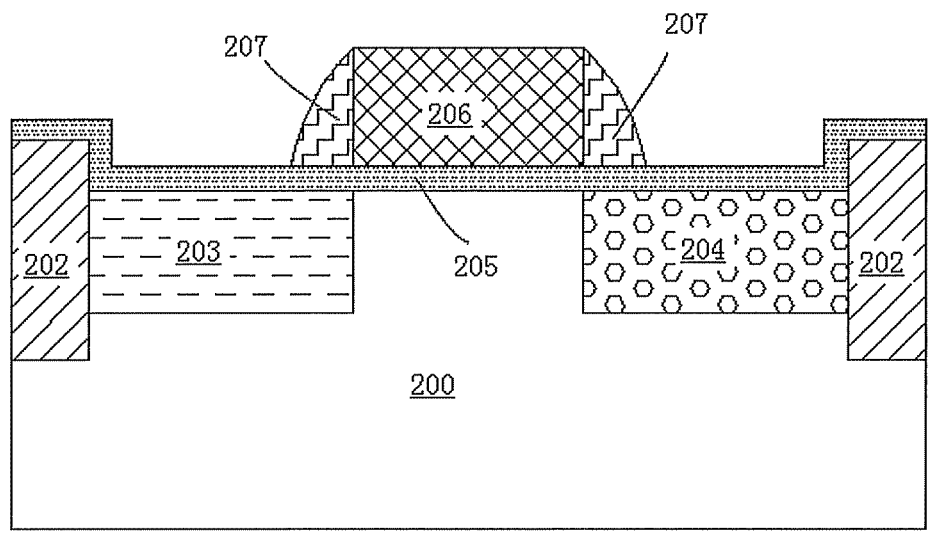

Seventh, strip the photoresist, cover the gate electrode 206 with an insulating film (silicon nitride for example); deposit a photoresist layer; perform masking, exposure, and development to form patterns; etch to remove the exposed silicon nitride film, wherein the rest of the silicon nitride film forms the grid flank wall 206 of the MOS transistor; strip the photoresist to obtain a structure as shown in FIG. 7.

Figure 8:
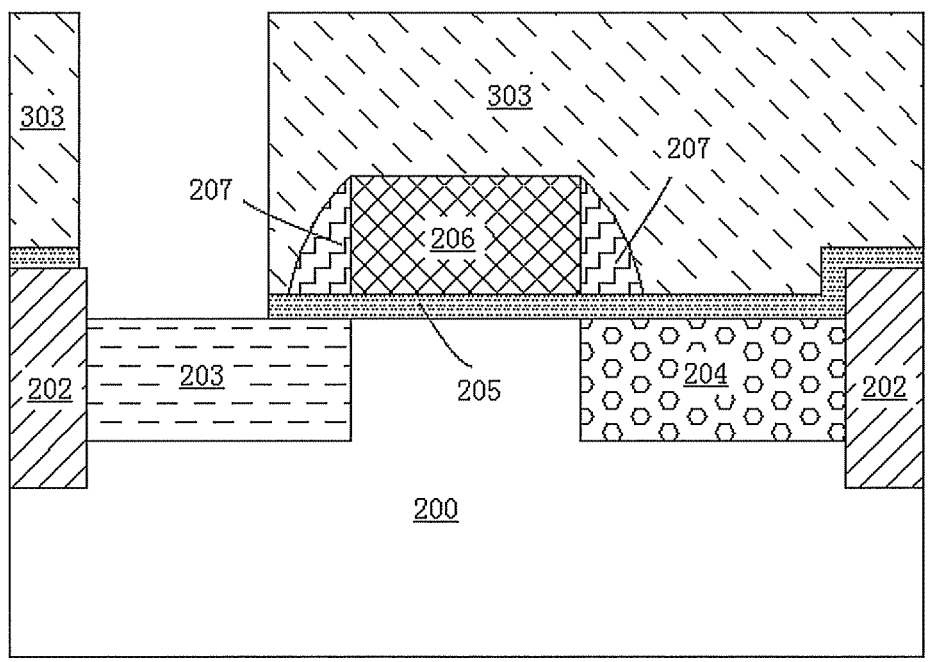

Eighth, deposit a photoresist layer 303 on the above mentioned structure; perform masking, exposure, and development to define the position of the source region of the tunnel transistor; etch to remove the gate dielectric layer 205 at the position of the source region to expose the source region 203, wherein the gate dielectric layer 205 reserved above the drain region 204 is used as the resistance-variable storage layer of the RRAM, as shown in FIG. 8.

Figure 9:
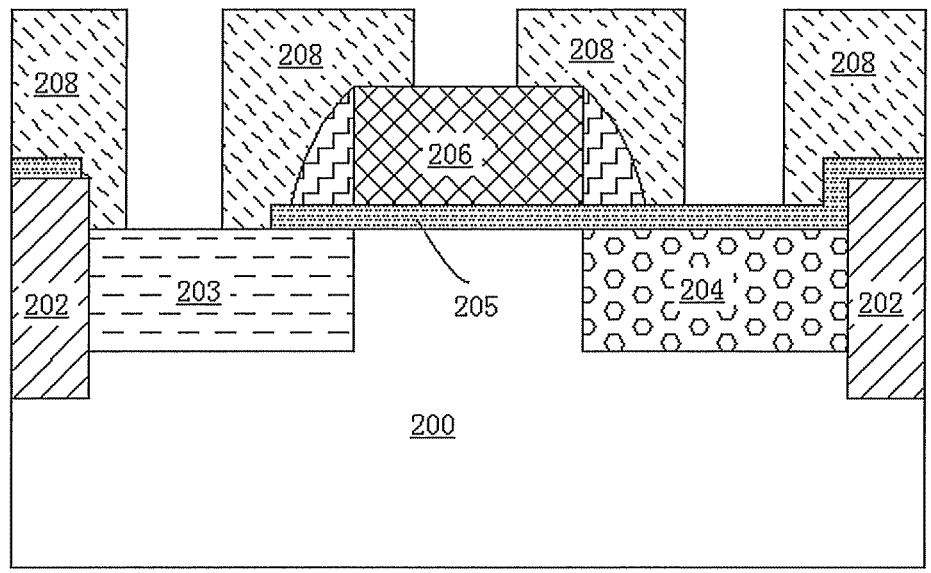
Figure 10:
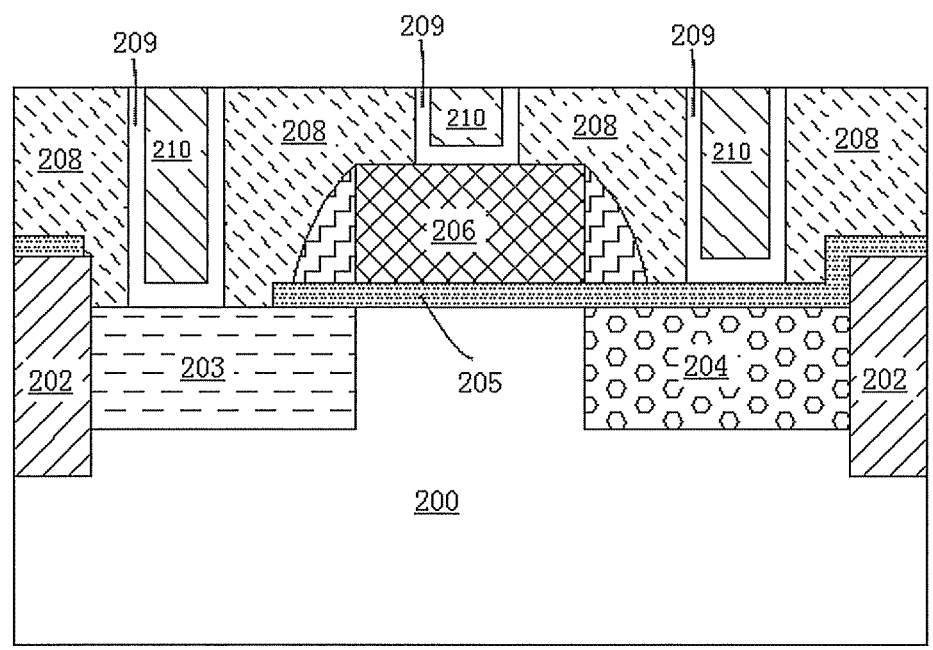

Ninth, strip the photoresist 303; cover the formed structure; deposit an insulating film 208 as the passivation layer (boron-phosphorosilicate glass for example) of this unit; deposit a photoresist layer on the passivation layer 208; perform masking, exposure, and development to define the position of a contact hole; etch to remove the silicon nitride film 208 at the position of the contact hole to form the contact hole, wherein the formed contact hole shall enable metal leads pass through the source region 203, the gate region 206 and the drain region 204; strip the photoresist to obtain the structure as shown in FIG. 9.

Tenth, form a metal plug in the contact hole; tungsten plug for example. To strengthen the adhesion force of the tungsten, usually an adhesive layer 209, such as TiN, is deposited in the contact hole first and then followed by the metal tungsten 210, and this unit after chemical and mechanical polishing can be seen in FIG. 10.

Figure 11:
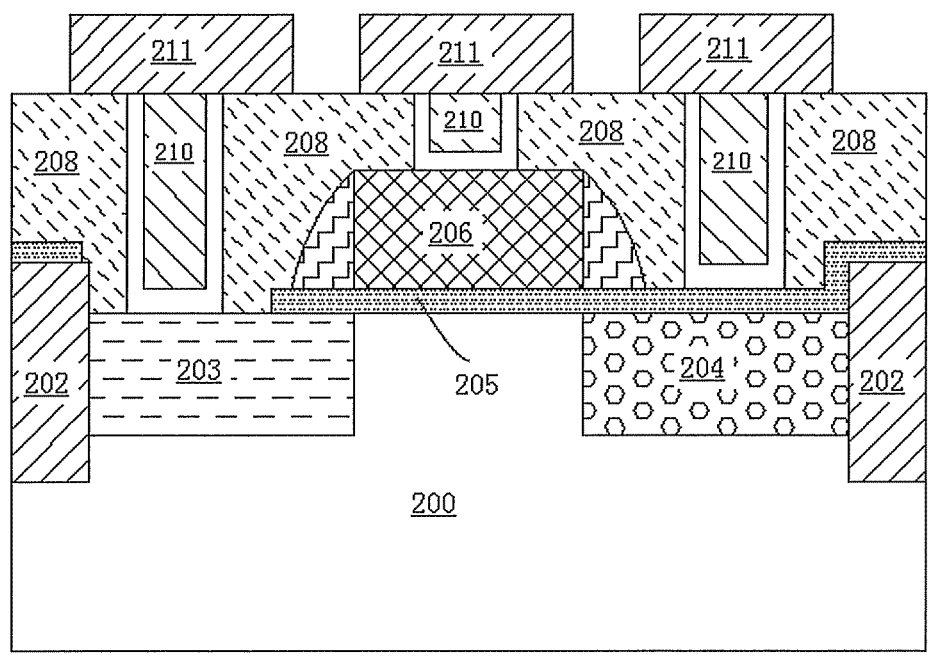

And eleventh, deposit a metal layer 211 such as aluminum on the above structure; deposit a photoresist layer on the metal layer 211; perform masking, exposure, and development to form patterns; etch to remove the exposed metal layer 211, form the source electrode, gate electrode and drain electrode with the rest of the metal layer; and strip the photoresist to obtain a structure as shown in FIG. 11.

As mentioned above, a plurality of embodiments with great differences may be constructed. It should be noted that, except for those defined in the attached claims, the present invention is not limited to the embodiments in the description.

The invention claimed is:

1. A tunnel transistor structure integrated with a resistance random access memory (RRAM), comprising:
   a semiconductor substrate; and
   a tunnel transistor and a RRAM formed on said semiconductor substrate,
   wherein a part of a gate dielectric layer of said tunnel transistor extends to a surface of a drain region of said tunnel transistor;
   wherein the part of the gate dielectric layer on the surface of the drain region of the tunnel transistor forms a resistance-variable storage layer of said RRAM;
   wherein a first surface of the resistance-variable storage layer of said RRAM is connected to the drain region; and
   wherein a second surface of the resistance-variable storage layer of said RRAM opposing the first surface is connected to an external drain electrode.

2. The tunnel transistor structure integrated with a RRAM according to claim 1, wherein said semiconductor substrate is silicon or silicon on an insulator.

3. The tunnel transistor structure integrated with a RRAM according to claim 1, wherein the gate dielectric layer of said tunnel transistor is made of a resistance-variable material with a high dielectric constant.

* * * * *